(12) United States Patent
Huang et al.

(10) Patent No.: US 8,902,652 B1
(45) Date of Patent: Dec. 2, 2014

(54) SYSTEMS AND METHODS FOR LOWER PAGE WRITES

(71) Applicant: SanDisk Technologies Inc., Plano, TX (US)

(72) Inventors: Jianmin Huang, San Carlos, CA (US); Bo Lei, San Ramon, CA (US); Jun Wan, San Jose, CA (US); Gerrit Jan Hemink, San Ramon, CA (US); Steven T. Sprouse, San Jose, CA (US); Dana Lee, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/276,925

(22) Filed: May 13, 2014

(51) Int. Cl.
*G11C 16/04* (2006.01)
*G11C 16/10* (2006.01)

(52) U.S. Cl.
CPC ........................... *G11C 16/10* (2013.01)
USPC ............... 365/185.03; 365/185.2; 365/189.08

(58) Field of Classification Search
USPC .............................. 365/185.03, 185.2, 189.08
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,768,192 A | 6/1998 | Eitan | |
| 5,774,397 A | 6/1998 | Endoh et al. | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 7,016,226 B2 | 3/2006 | Shibata et al. | |
| 7,057,939 B2 | 6/2006 | Li et al. | |
| 7,120,051 B2 | 10/2006 | Gorobets et al. | |
| 7,315,916 B2 | 1/2008 | Bennett et al. | |
| 7,505,320 B2 | 3/2009 | Li | |
| 7,508,721 B2 | 3/2009 | Li et al. | |
| 7,594,157 B2 * | 9/2009 | Choi et al. ..................... 714/764 |
| 7,755,950 B2 * | 7/2010 | Yu et al. ................... 365/185.28 |
| 7,951,669 B2 | 5/2011 | Harari et al. | |

(Continued)

FOREIGN PATENT DOCUMENTS

| | | |
|---|---|---|
| WO | WO2012087411 | 6/2012 |
| WO | WO 2012/158521 | 11/2012 |
| WO | WO2012174216 | 12/2012 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Pho M Luu
(74) *Attorney, Agent, or Firm* — Davis Wright Tremaine LLP

(57) ABSTRACT

In a Multi Level Cell (MLC) memory array block in which lower pages are written first, before any upper pages, the lower page data is subject to an exclusive OR (XOR) operation so that if any lower page becomes uncorrectable by ECC (UECC) then the page can be recovered using XOR. Lower pages in such blocks may be written in nonsequential order.

22 Claims, 16 Drawing Sheets

(56) References Cited

U.S. PATENT DOCUMENTS

| | | | |
|---|---|---|---|
| 8,046,528 B2 * | 10/2011 | Chu et al. | 711/103 |
| 8,094,400 B1 | 1/2012 | Han | |
| 8,214,700 B2 | 7/2012 | Chen | |
| 8,244,960 B2 | 8/2012 | Paley et al. | |
| 8,307,241 B2 * | 11/2012 | Avila et al. | 714/6.2 |
| 8,472,280 B2 * | 6/2013 | Li | 365/238.5 |
| 8,539,311 B2 * | 9/2013 | Steiner et al. | 714/764 |
| 8,566,671 B1 | 10/2013 | Ye et al. | |
| 8,750,042 B2 | 6/2014 | Sharon et al. | |
| 2007/0109858 A1 | 5/2007 | Conley et al. | |
| 2010/0174847 A1 | 7/2010 | Paley et al. | |
| 2010/0318721 A1 | 12/2010 | Avila et al. | |
| 2010/0318839 A1 | 12/2010 | Avila et al. | |
| 2011/0072332 A1 | 3/2011 | Tomlin | |
| 2011/0096601 A1 | 4/2011 | Gavens et al. | |
| 2011/0099418 A1 | 4/2011 | Chen | |
| 2011/0099460 A1 | 4/2011 | Dusija et al. | |
| 2011/0149650 A1 | 6/2011 | Huang et al. | |
| 2011/0153912 A1 | 6/2011 | Gorobets et al. | |
| 2011/0267885 A1 | 11/2011 | Kato | |
| 2012/0182803 A1 | 7/2012 | Shirakawa | |
| 2012/0220088 A1 | 8/2012 | Alsmeier | |
| 2012/0256247 A1 | 10/2012 | Alsmeier | |
| 2012/0272120 A1 | 10/2012 | Chen | |
| 2012/0287710 A1 | 11/2012 | Shirakawa | |
| 2012/0297122 A1 | 11/2012 | Gorobets et al. | |
| 2012/0311244 A1 | 12/2012 | Huang et al. | |
| 2013/0024605 A1 | 1/2013 | Sharon et al. | |
| 2013/0028021 A1 | 1/2013 | Sharon et al. | |
| 2013/0031429 A1 | 1/2013 | Sharon et al. | |
| 2013/0031430 A1 | 1/2013 | Sharon et al. | |
| 2013/0031431 A1 | 1/2013 | Sharon et al. | |
| 2013/0107628 A1 | 5/2013 | Dong et al. | |
| 2013/0155769 A1 | 6/2013 | Li et al. | |

OTHER PUBLICATIONS

U.S. Appl. No. 13/788,415 entitled "Write Sequence Providing Write Abort Protection," filed Mar. 7, 2013, 36 pages.

U.S. Appl. No. 14/099,027 entitled "Lower Page Only Host Burst Writes," filed Dec. 6, 2013, 46 pages.

U.S. Appl. No. 13/929,368, entitled Efficient Post Write Read in Three Dimensional Nonvolatile Memory, filed Jun. 27, 2013, 49 pages.

U.S. Appl. No. 13/934,013, entitled Write Operations for Defect Management in Nonvolatile Memory, filed Jul. 2, 2013, 47 pages.

U.S. Appl. No. 14/086,162, entitled Update Block Programming Order, filed Nov. 21, 2013, 45 pages.

U.S. Appl. No. 14/094,550 entitled "Multi-Die Write Management," filed Dec. 2, 2013, 32 pages.

U.S. Appl. No. 14/097,523, entitled Systems and Methods for Partial Page Programming of Multi Level Cells, filed Dec. 5, 2013, 41 pages.

* cited by examiner

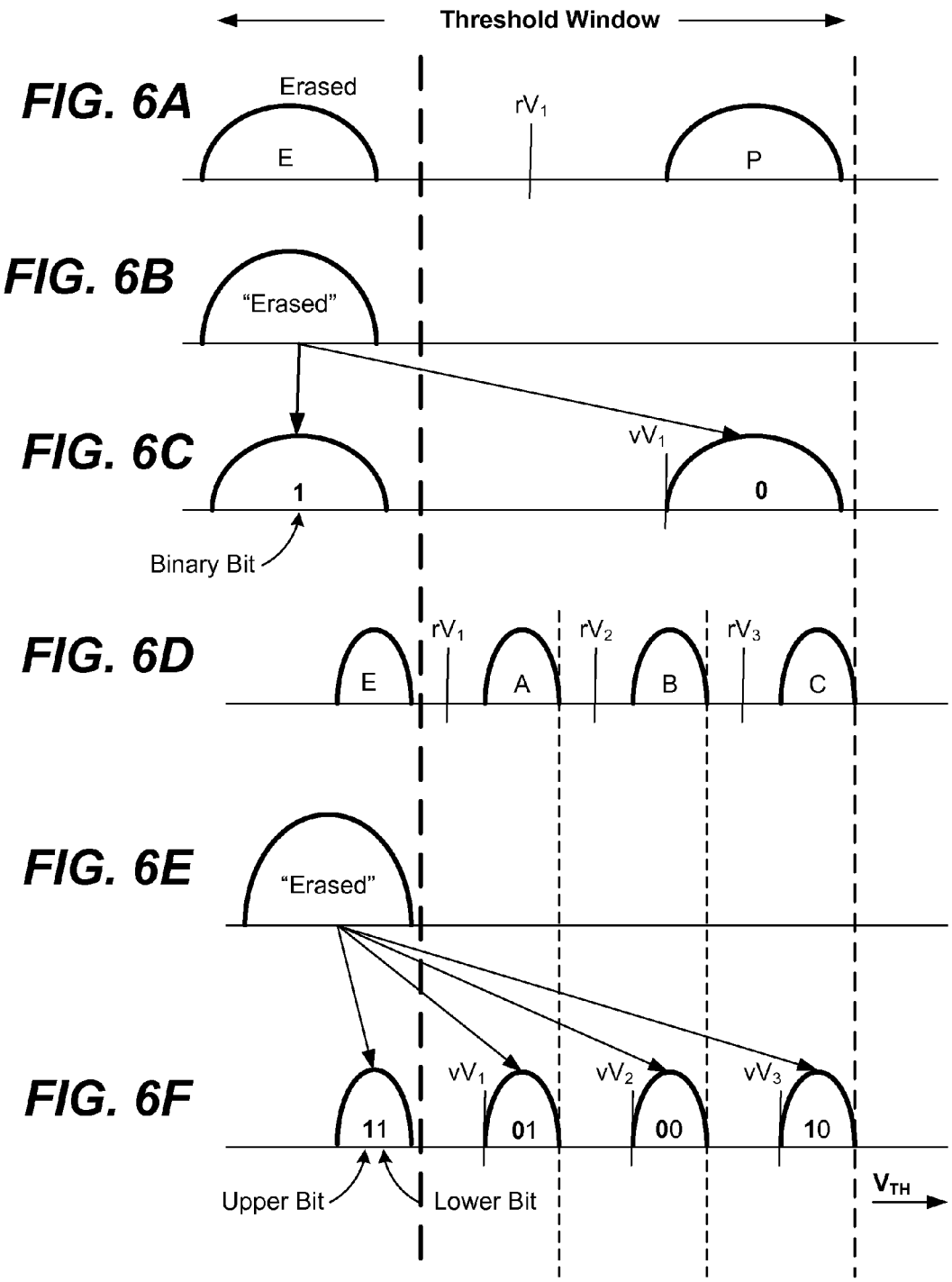

Multistate Memory

Lower Page Programming (2-bit Code)

Upper Page Programming (2-bit Code)

Lower Page Read (2-bit Code)

Upper Page Read (2-bit Code)

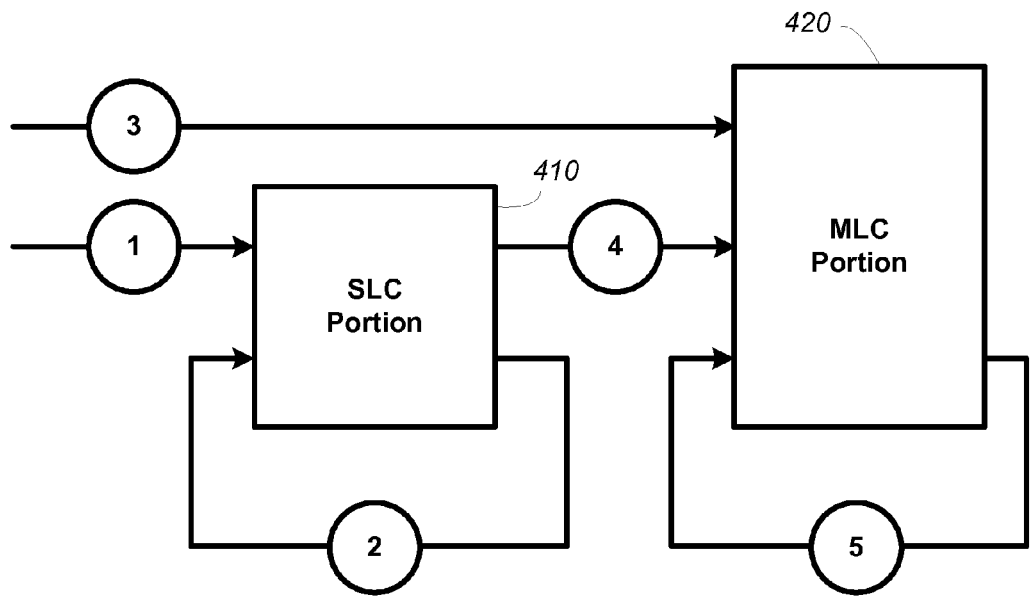
FIG. 10
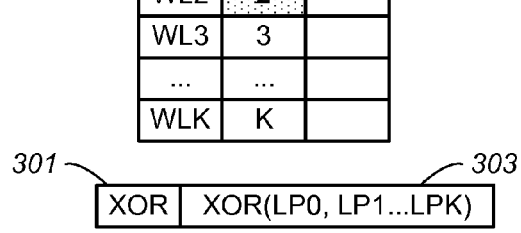
FIG. 11
FIG. 13A
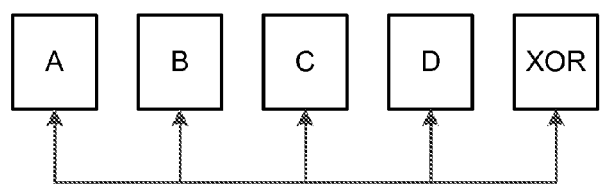
FIG. 12
FIG. 13B

| | LP | UP |
|---|---|---|
| WL0 | 0 | |
| WL1 | | |
| WL2 | 2 | |
| WL3 | | |
| WL4 | 4 | |
| WL5 | | |
| WL6 | 6 | |
| WL7 | | |
| ... | ... | ... |
| WLK-1 | K-1 | |
| WLK | | |

| XOR | XOR(LP0, LP2...LPK-1) |
|---|---|

| | LP | UP |
|---|---|---|
| WL0 | 0 | |
| WL1 | 1 | |
| WL2 | 2 | |
| WL3 | 3 | |
| WL4 | 4 | |
| WL5 | 5 | |
| WL6 | 6 | |
| WL7 | 7 | |
| ... | ... | ... |
| WLK-1 | K-1 | |
| WLK | K | |

| XOR | XOR(LP0, LP1...LPK) |
|---|---|

| | LP | UP |
|---|---|---|
| WL0 | 0 | |
| WL1 | 1 | |
| WL2 | 2 | |
| WL3 | 3 | |
| WL4 | | |
| WL5 | | |
| WL6 | | |
| WL7 | 7 | |
| ... | ... | ... |
| WLK-1 | K-1 | |
| WLK | K | |

| | LP | UP |
|---|---|---|
| WL0 | 0 | |
| WL1 | 1 | |
| WL2 | 2 | |
| WL3 | 3 | |
| WL4 | 4 | |
| WL5 | 5 | |
| WL6 | 6 | |
| WL7 | 7 | |
| ... | ... | ... |
| WLK-1 | K-1 | |
| WLK | K | |

|  | LP | UP |
|---|---|---|
| WL0 | 0 |  |
| WL1 | 1 |  |
| WL2 | 2 |  |
| WL3 | 3 |  |
| WL4 |  |  |
| WL5 |  |  |
| ... | ... | ... |
| WLX | X |  |
| WLX+1 | X+1 |  |
| WLX+2 | X+2 |  |
| WLX+3 |  |  |
| ... | ... | ... |
| WLK |  |  |

SYSTEMS AND METHODS FOR LOWER PAGE WRITES

BACKGROUND

This application relates to the operation of re-programmable nonvolatile memory systems such as semiconductor flash memory which record data using charge stored in charge storage elements of memory cells and to methods of operating such memory systems.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

In a Multi Level Cell (MLC) memory array, a burst of data from a host may be written in only lower pages of a block. This provides a very fast way to write data so that challenging time constraints can be met for such bursts. Blocks that are written with only lower page data may later have upper pages written with data copied from elsewhere in the memory array. Lower page data in such blocks may be subject to an XOR operation prior to storage and the XOR output that is produced by the operation may be stored until all upper page data is written. In this way, if a write abort occurs during upper page writing then the affected lower page data may be recovered by reversing the XOR operation. When writing only lower page data, the order of programming may be nonsequential so that some word lines are skipped. For example, odd word lines may be programmed with lower page data first, then even word lines, or vice versa. Certain word lines may be skipped to allow later copying of data to the skipped word lines so that the data is written in a logically sequential arrangement.

An example of a method of operating a Multi Level Cell (MLC) nonvolatile memory array includes: programming a plurality of word lines of a block with lower page data, leaving unwritten upper page capacity along the plurality of word lines; performing an Exclusive OR (XOR) operation on the lower page data of the plurality of word lines of the block; subsequently, maintaining results of the XOR operation for a period of time after the lower page data is programmed; and subsequently, during the period of time when results of the XOR operation are maintained, writing upper page data along the plurality of word lines of the block.

Subsequent to writing the upper page data along the plurality of word lines of the block, the results of the XOR operation may be discarded. All word lines of the block may be written with lower page data prior to any word lines of the block being written with upper page data. The XOR operation may be applied to all lower page data of the block. The XOR operation may be applied to lower page data across a plurality of blocks. A plurality of XOR operations may be performed as the plurality of word lines of the block are written so that accumulated XOR results are maintained throughout programming of the plurality of word lines of the block with lower page data. The XOR operation may be performed only once, prior to programming any upper page data in the block. The plurality of word lines may be programmed with only lower page data in a nonsequential manner that skips one or more word lines of the block. The MLC nonvolatile memory array may be a three dimensional memory array that is monolithically formed as a plurality of physical levels of memory cells, a physical level having an active layer disposed above a silicon substrate, the memory cells in communication with operating circuitry.

An example of a method of operating a Multi Level Cell (MLC) nonvolatile memory array includes: programming three or more word lines of a block with lower page data prior to programming any of the three or more word lines with upper page data, the three or more word lines programmed in a non-sequential order; and subsequently, while the lower page data remains in the block, writing upper page data in the block.

The non-sequential order may program lower page data to odd numbered word lines first and may subsequently program lower page data to even numbered word lines, or may program lower page data to even numbered word lines first and may subsequently program lower page data to odd numbered word lines. Different programming parameters may be used for programming lower page data to odd numbered word lines and programming lower page data to even numbered word lines. The three or more word lines may be programmed in non-sequential order that skips one or more word lines. The one or more skipped word lines may correspond to skipped logical addresses in data to be stored. The skipped word lines may subsequently be programmed so that, subsequent to programming the skipped word lines, data in the plurality of word lines and the skipped word lines is sequential. The MLC nonvolatile memory array may be a three dimensional memory array that is monolithically formed as a plurality of physical levels of memory cells, a physical level having an active layer disposed above a silicon substrate, the memory cells in communication with operating circuitry. An exclusive OR (XOR) operation may be performed on lower page data of the three or more word lines prior to the writing of upper page data in the block.

An example of a Multi-Level Cell (MLC) nonvolatile memory includes: an array of MLC nonvolatile memory cells monolithically formed in physical levels, a level having an active area disposed above a silicon substrate, the array including at least one block in which three or more word lines are programmed with lower page data prior to any of the three or more word lines being programmed with upper page data; an exclusive OR (XOR) circuit that performs an XOR operation on lower page data of the three or more word lines and generates a corresponding XOR output; and an XOR storage element that maintains the output of the XOR circuit until after upper page data is written in the at least one block.

All lower pages of an individual block may be subject to a single XOR operation by the XOR circuit. An XOR operation may extend across lower page data of multiple blocks.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6F illustrate examples of programming a population of memory cells.

FIG. 10 illustrates an example of operation of SLC and MLC portions in a memory system.

FIG. 11 illustrates programming an MLC block with lower page data first, before any upper page data.

FIG. 12 shows an example of a write abort during upper page programming.

FIG. 13A shows an example of XORing pages of data in a block.

FIG. 13B shows an example of XORing pages of different blocks.

DETAILED DESCRIPTION

Memory System

Figure 1:
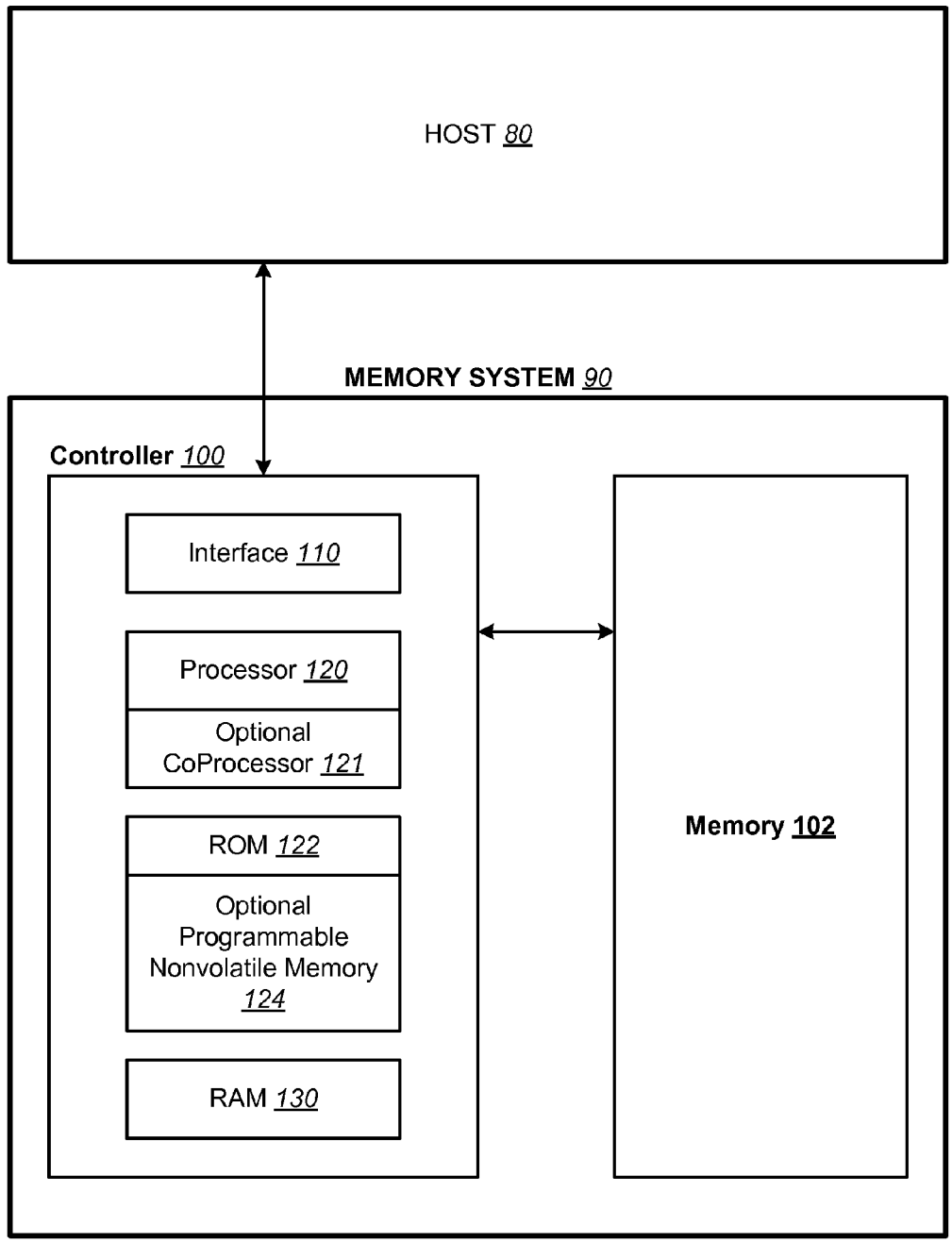
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Physical Memory Example

Figure 2:
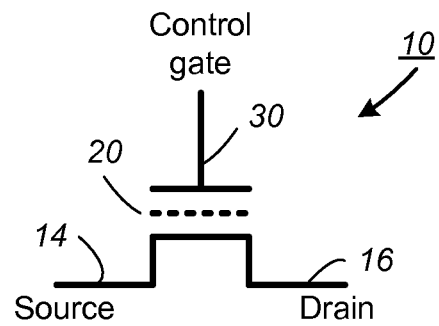
FIG. 2 illustrates schematically a non-volatile memory cell.

FIG. 2 illustrates schematically an example of a non-volatile charge-storage memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

Figure 3:
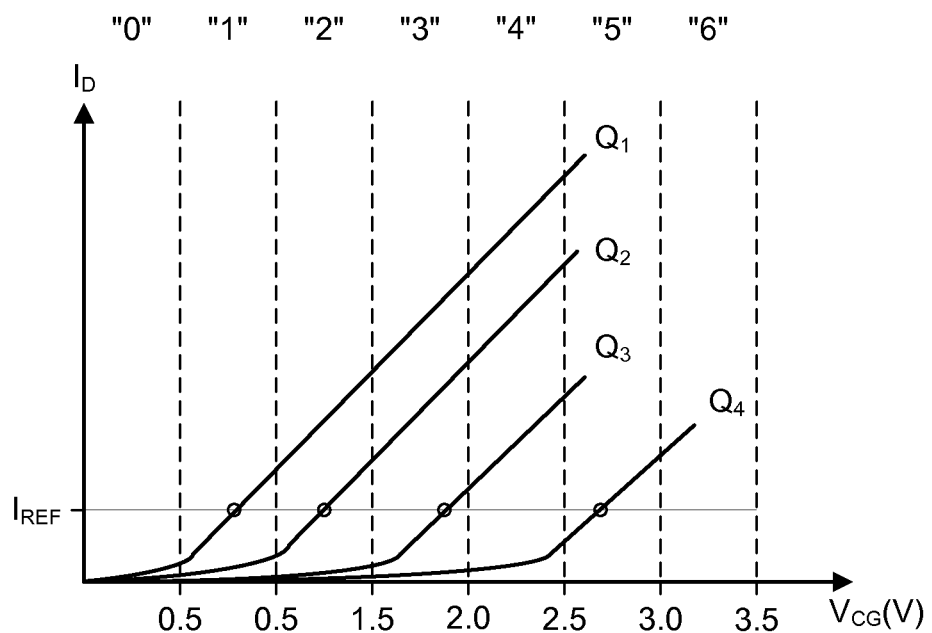
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, TREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
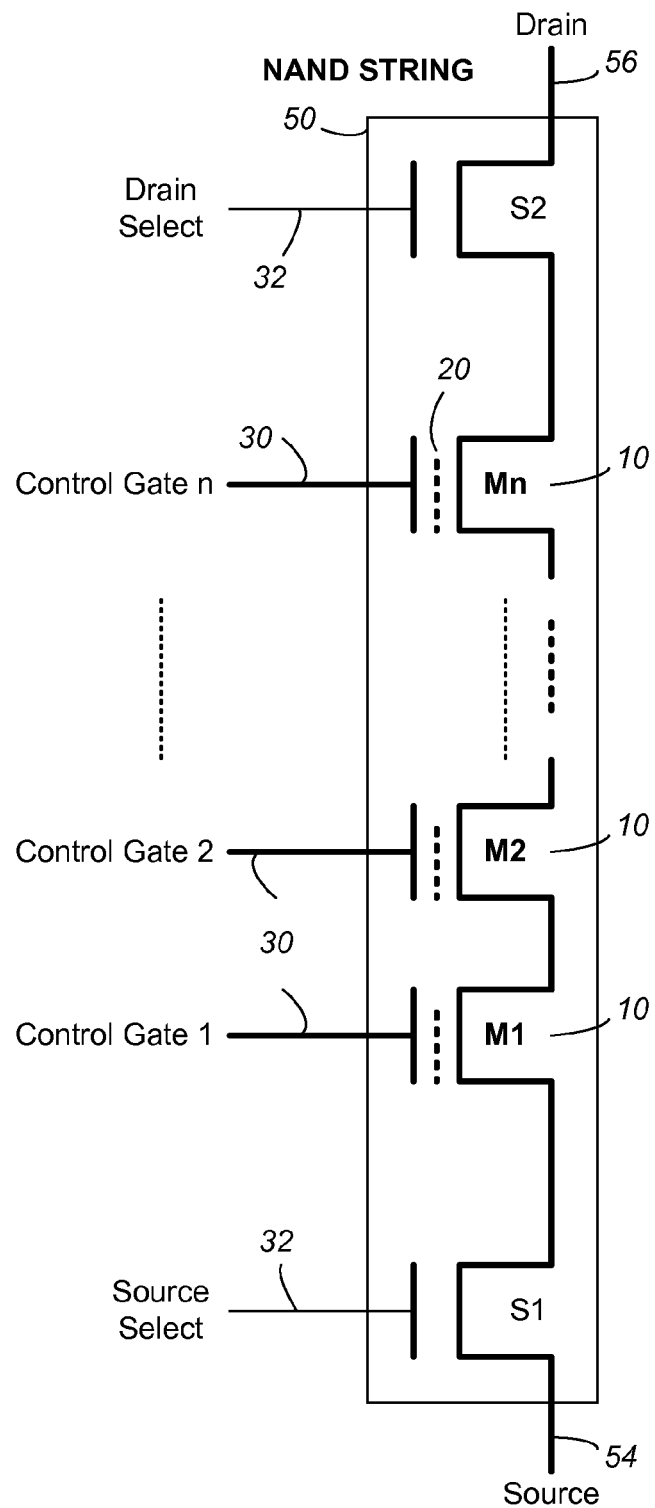
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
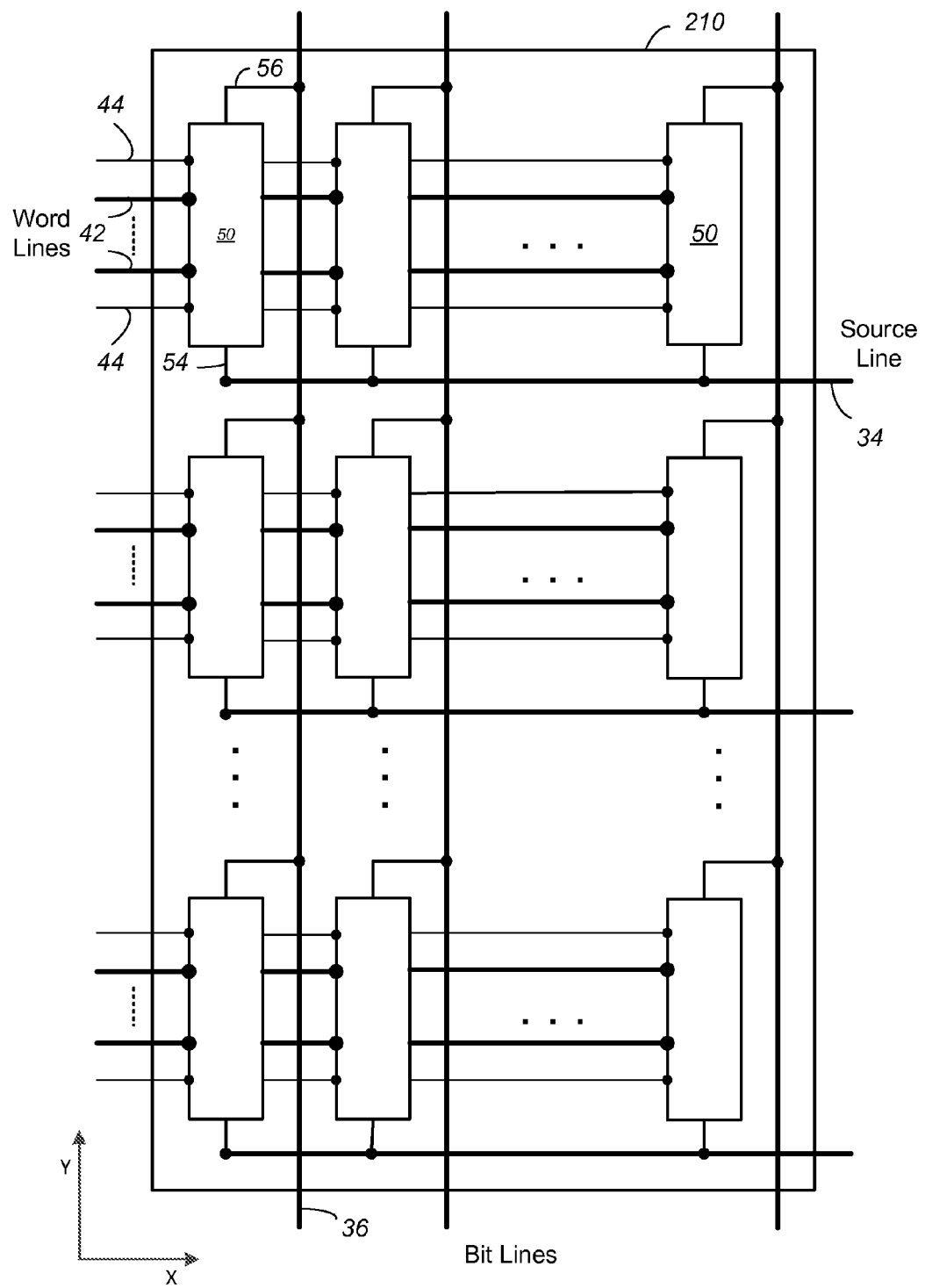
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
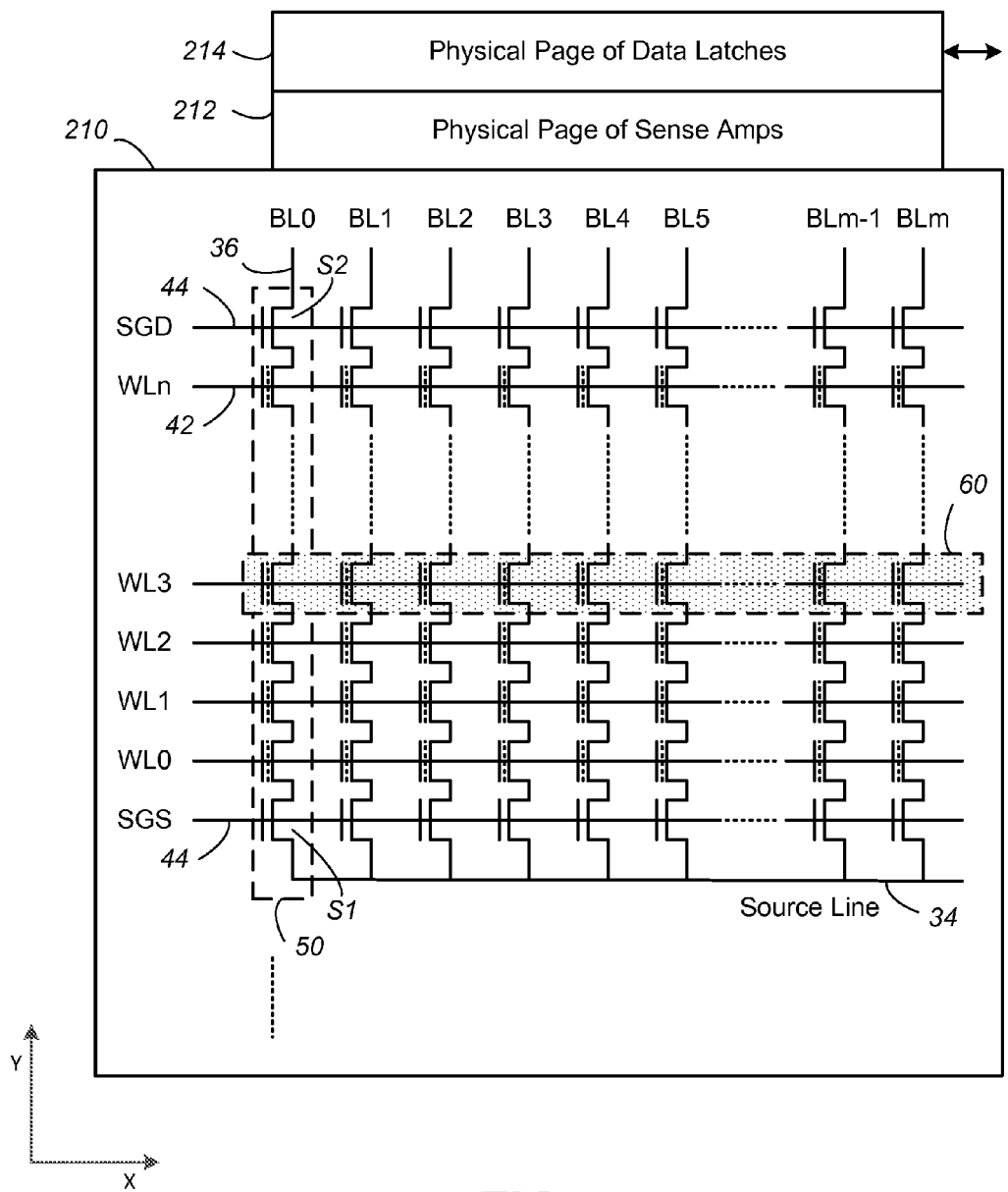
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector may include user data and overhead data.

SLC and MLC Programming

FIG. 6A-6C illustrate an example of a population of 2-state memory cells (Single Level Cells, or "SLC" cells). FIG. 6A illustrates how the population of memory cells are programmable into two distinct distributions of threshold voltages, an erased state, "E" and a programmed state, "P." Memory cells may be read by determining whether their threshold voltages are above or below a read voltage, $rV_1$. FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into a zone demarcated by verify level $vV_1$. In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

FIG. 6D-6F illustrate an example of programming a population of 4-state memory cells (MLC cells). It will be understood that memory cells may be configurable as either 2-state or 4 state so that the same memory cells may be SLC at one time and MLC at another time. Typically memory cells are configured as SLC or MLC on a block by block basis so that all cells of a block are operated together as either an SLC block or an MLC block at any given time. FIG. 6D illustrates the population of memory cells programmable into four distinct distributions of threshold voltages respectively representing memory states "E", "A", "B" and "C". FIG. 6E illustrates the initial distribution of "erased" threshold voltages for an erased memory. FIG. 6F illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the erased state. As the memory gets more programming, the initial distribution of the erased state as shown in FIG. 6E will become narrower.

A 2-bit code having a lower bit and an upper bit can be used to represent each of the four memory states. For example, the "E", "A", "B" and "C" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

While the examples above illustrate 2-state SLC operation and 4-state MLC operation, it will be understood that MLC operation is not limited to 4-state examples. For example, eight threshold voltage distributions may be used to store three bits per cell. Other numbers of threshold voltage distributions may be used to store other numbers of bits per cell.

Bit-by-Bit MLC Programming and Reading

Figure 7A:
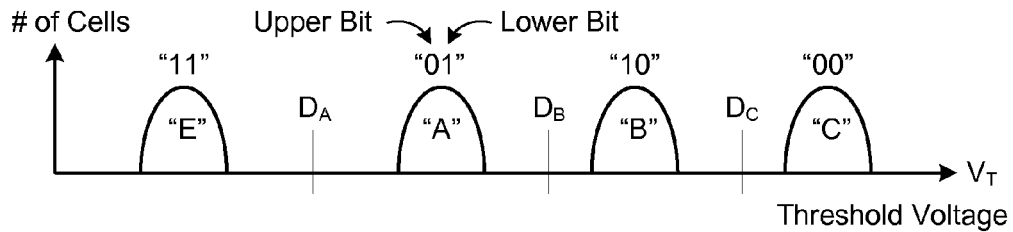
FIGS. 7A-7E illustrate programming of upper and lower page bits in MLC.

FIGS. 7A-7E illustrate the programming and reading of a 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

Figure 7B:
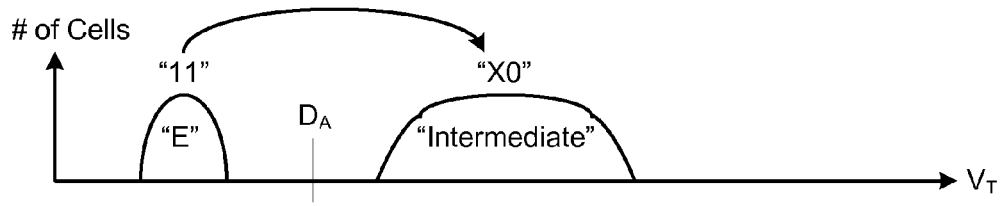

FIG. 7B illustrates the lower page programming (lower bit) in a 2-pass programming scheme using the 2-bit code. The first pass lower page programming has the logical state (upper bit, lower bit)=(1, 1) transits to some intermediate state (x, 0) as represented by programming the "unprogrammed" memory state "E" to the "intermediate" state designated by (x, 0) with a programmed threshold voltage greater than $D_A$ but less than $D_C$. Memory cells programmed with lower page bits only (no upper page bits) may be read using $D_A$.

Figure 7C:
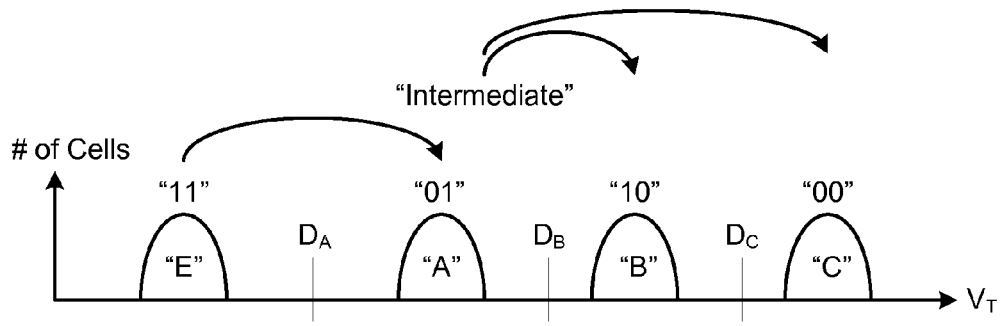

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "E" to "A". If the lower page bit is at "0", the logical state (0, 0) is obtained by programming from the "intermediate" state to "C". Similarly, if the upper page is to remain at "1", while the lower page has been programmed to "0", it will require a transition from the "intermediate" state to (1, 0) as represented by programming the "intermediate" state to "B".

Figure 7D:
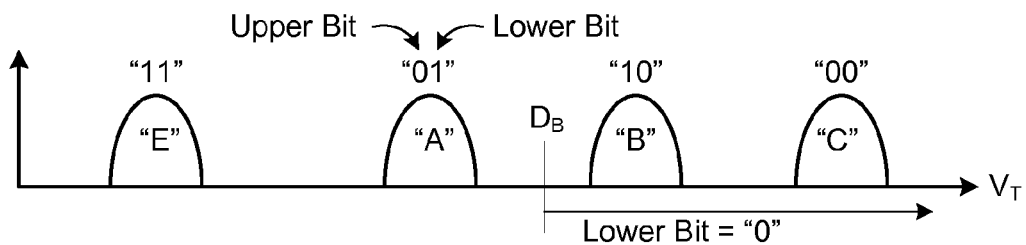

FIG. 7D illustrates the read operation that is required to discern the lower bit of the 4-state memory encoded with the 2-bit code. If the upper page has been programmed then a read operation using $D_B$ will yield the lower page data correctly. On the other hand, if the upper page has not yet been programmed, the lower page data should be read by a read operation using $D_A$.

Figure 7E:
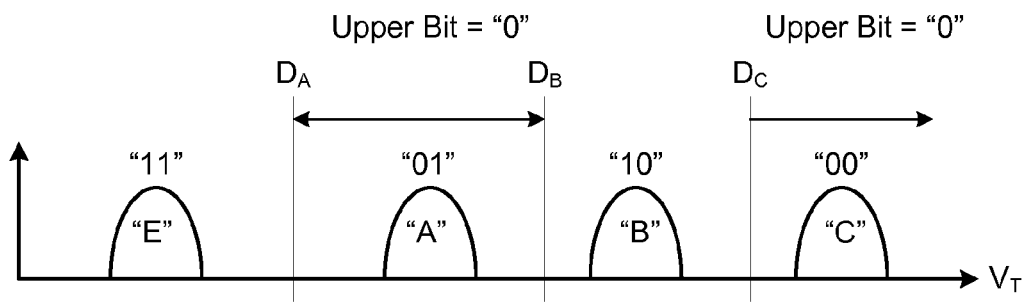

FIG. 7E illustrates the read operation that is required to discern the upper bit of the 4-state memory encoded with the 2-bit code. As is clear from the figure, the upper page read will require a 3-pass read relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page. For example, where memory cells store three bits per cell (using eight states), a physical page of memory cells may store three logical pages, a lower page, a middle page, and an upper page.

Comparing the lower page programming of FIG. 7B with the upper page programming of FIG. 7C shows some important differences. Lower page programming raises threshold voltages less than upper page programming (i.e. the intermediate state is not as high as B and C states). Also, the intermediate distribution is broad so that programming does not have to be very precise. Accordingly, lower page programming may be performed more rapidly than upper page programming. Reading of data stored as lower page only (no upper page data) may also be quicker than reading upper page data because a single read (single discrimination voltage, e.g. FIG. 7B) may provide lower page data while three reads (three discrimination voltages, e.g. FIG. 7E) may be needed to obtain upper page data.

3-D NAND Example

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 8B:
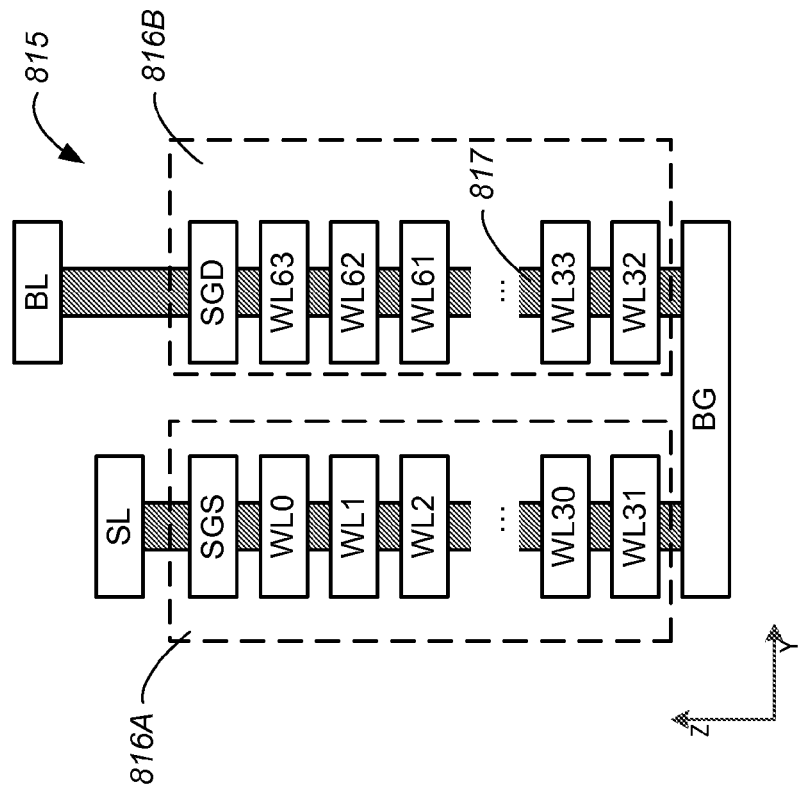
FIG. 8B shows an example of a physical structure of a U-shaped 3-D NAND string.
Figure 8A:
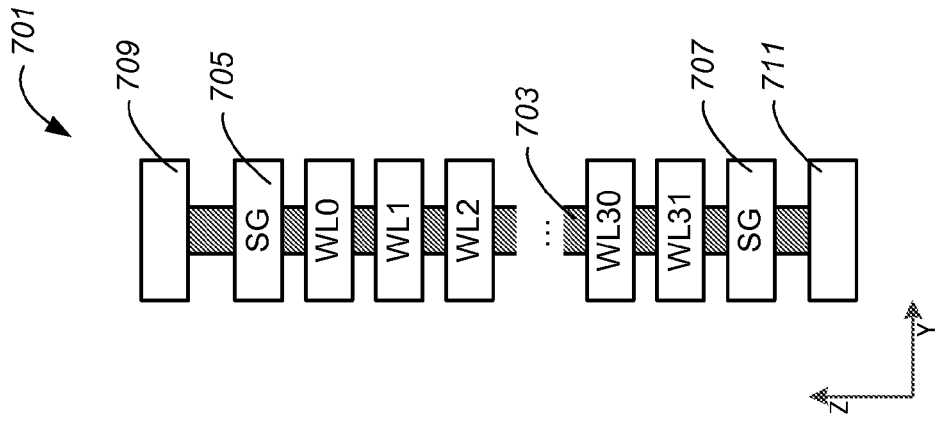
FIG. 8A shows an example of a physical structure of a 3-D NAND string.

FIG. 8A shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8A shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8B shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
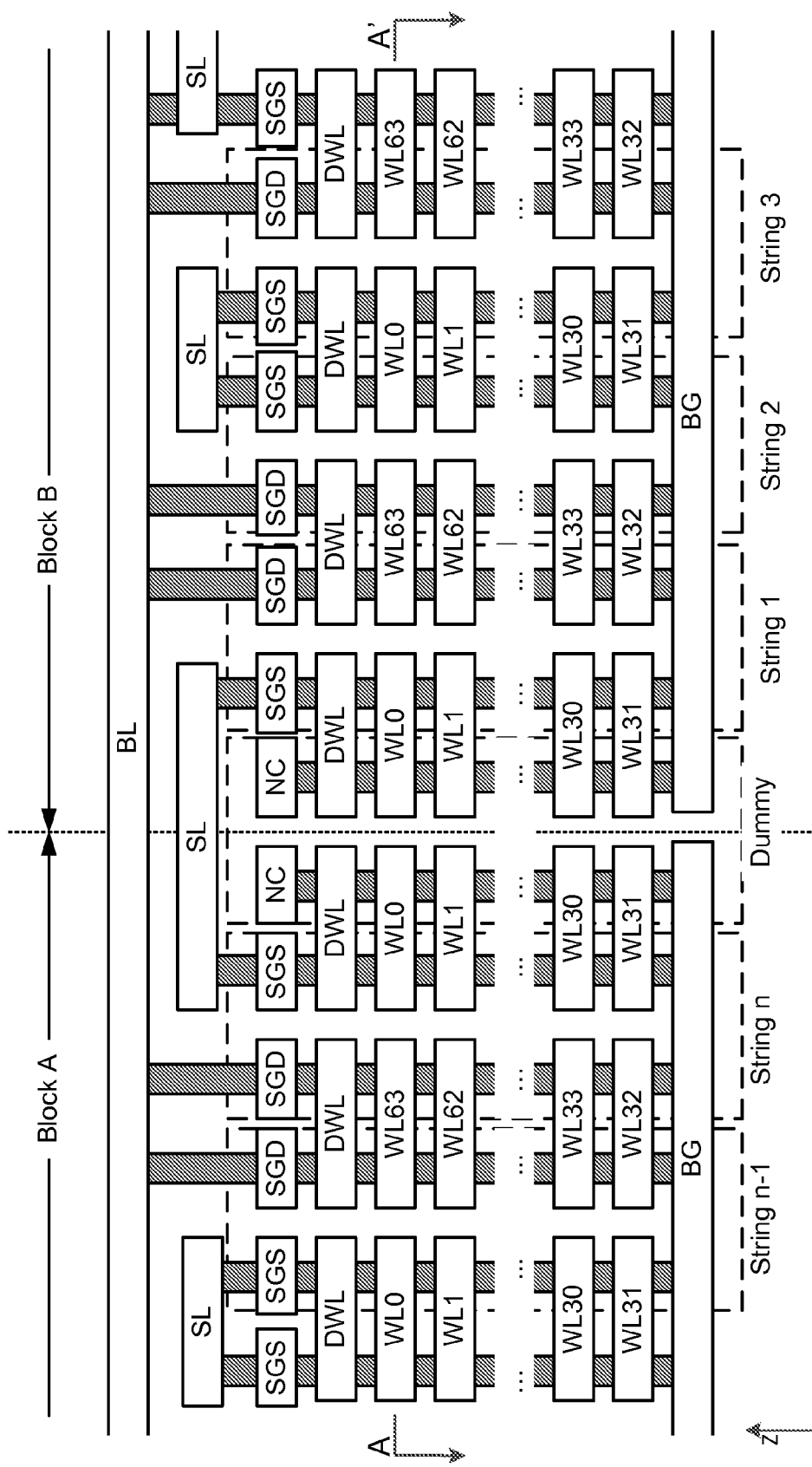
FIG. 9A shows a cross section of a 3-D NAND memory array in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Figure 9B:
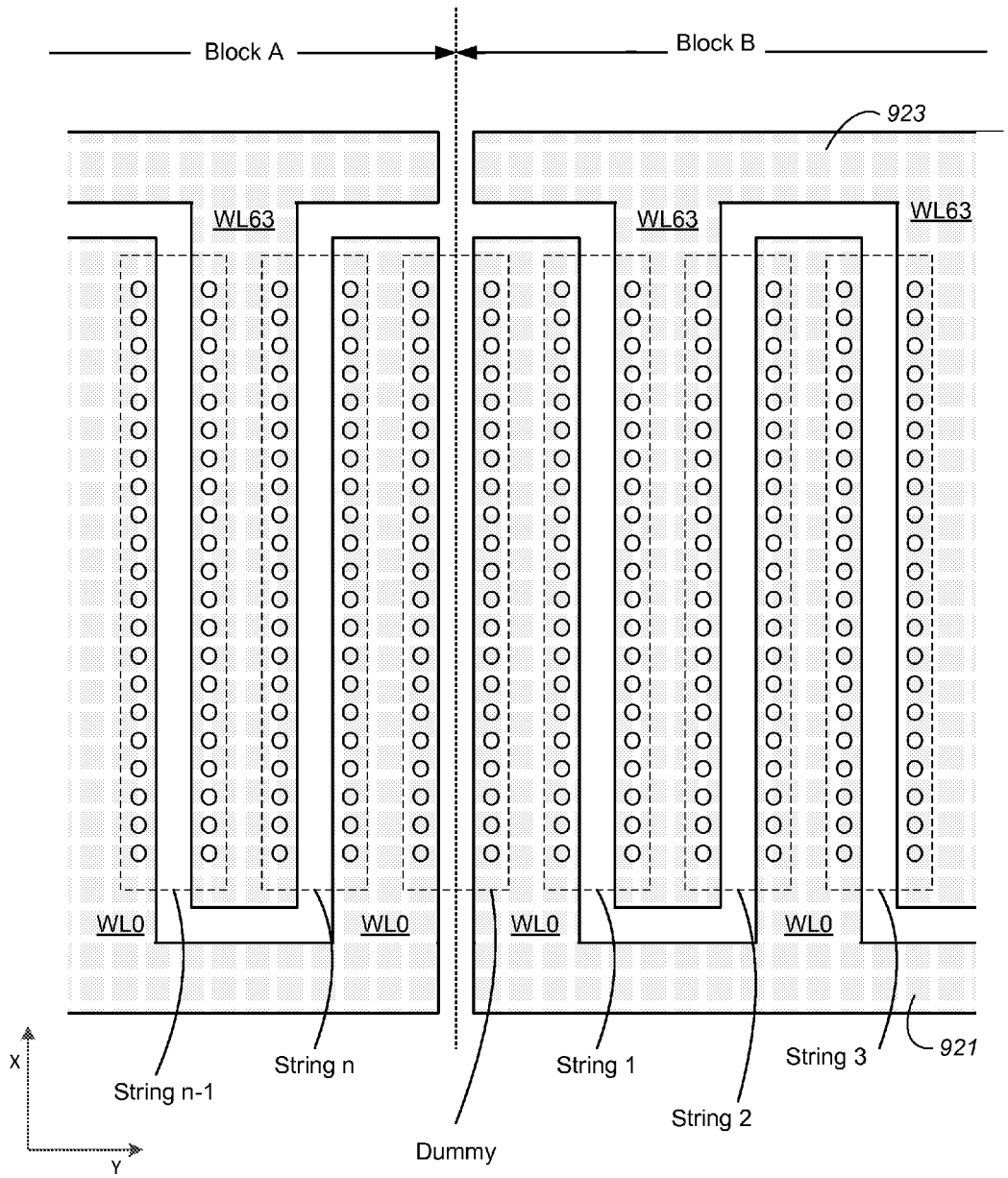
FIG. 9B shows a cross section of the 3-D NAND memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

SLC and MLC Operation

In both two dimensional and three dimensional memories, it is common to operate some blocks in a memory array as SLC blocks and others as MLC blocks. For example, data that is expected to be stored for a relatively long period without updates may be stored in MLC blocks while data that is likely to be frequently updated may be stored in SLC. Blocks may be configured as SLC or MLC according to requirements.

FIG. 10 illustrates schematically the data path between an SLC portion 410 and an MLC portion 420 in an example of a memory that has both SLC blocks and MLC blocks. This may be considered a two layer system. The first layer is the main input buffer for incoming data and operates on the SLC portion 410 of a NAND memory which is faster/higher-endurance/higher-cost memory compared to the MLC portion 420. The second layer is the main data archive storage and operates on the MLC portion which is slower/lower-endurance/lower-cost memory.

The main operations in such system are labeled in FIG. 10 are as follows:

1. Host data or control data write to SLC portion
 2. Data copy within SLC portion to reclaim partially obsolete SLC block, sometimes referred to as 'compaction'
 3. Host data direct write to MLC portion, usually used for long sequential writes
 4. Data move from SLC to MLC portion, sometimes referred to as 'folding'
 5. Data copy within MLC portion for MLC block reclaim, sometimes referred to as 'MLC compaction'

The above structure can be built with many other additional features, for example related to the use of different addressing schemes and addressable data unit granularity.

Burst Mode

In some cases, it is desirable to write data quickly, even at the expense of storage density, by writing just one bit per cell initially. The data can later be stored in a more efficient manner (two or more bits per cell) when time permits. Data may be written as lower page data in a burst mode and later upper page data may be written in the same block so that the lower page data does not have to be copied prior to using the block for MLC storage. Examples of such burst mode operation are described in U.S. patent application Ser. No. 14/099, 027, filed on Dec. 6, 2013, entitled "Lower page only host burst writes" which is hereby incorporated by reference in its entirety.

FIG. 11 illustrates a block that has been programmed using a lower-page-only scheme (e.g. a host burst scheme). All word lines of a block (WL0-WLK representing K+1 word lines of the block) have lower page ("LP") data while none of the word lines have any upper page ("UP") data. Such lower page data may be very rapidly written. Subsequently, the unused upper page capacity may be used by copying data from elsewhere in the memory array. This may be done at a time when high speed is not required (e.g. as a background operation).

One potential problem with lower-page-only programming relates to a write abort during subsequent writing of upper page data. Writing of upper page data may occur some significant time after lower page data is written. Therefore, in many cases, the data that is stored in such lower pages may not be available elsewhere. The data may be considered "committed" so that a host does not maintain a copy. If a write abort occurs during programming of upper page data then memory cell states may not be resolvable into their destination states (i.e. they may not yet be fully programmed to their destination states). However, they may have been sufficiently programmed so that they are no longer in their prior states (i.e. no longer in states reflecting lower-page-only programming). In this condition, lower page data may be unreadable.

FIG. 12 shows an example in which a write abort occurs during programming of upper page data in a block that was previously programmed with lower page data. After upper page programming of logical pages X and X+1 completed successfully on WL0 and WL1, a write abort occurred during programming of logical page X+2 along WL2 leaving memory cells in intermediate states. In this case, logical page 2, which is stored as lower page data along WL2, may be unrecoverable by reading WL2. While upper page data X+2 was not fully written and may also be unreadable from WL2, this data may still be available elsewhere. For example, because it was not yet confirmed as written the host may maintain a copy. Or, if the data is being copied from another block in the memory then it may be available from that block. The data may also be buffered elsewhere during writing (e.g. in a buffer in a memory controller). However, lower page data may not be stored elsewhere.

In order to allow recovery of lower page data that is unreadable as a result of a write abort during upper page programming, lower page data may be subject to an exclusive OR (XOR) operation so that if a lower page becomes unreadable it may be recovered by XORing the XOR results and the other lower pages. An XOR circuit may be provided to calculate an XOR output and an XOR storage unit may store the XOR output until upper page data is written (i.e. until the danger from an upper page write abort is over).

FIG. 13A shows an example that includes an XOR circuit 301 and an XOR storage unit 303 that contains an XOR output that is the result of an XOR operation applied to lower pages 0-K of WL0-WLK (i.e. applied to all lower page data of the block). The XOR storage unit 303 may be located in a memory controller (e.g. in controller RAM), or may be in peripheral circuits on a memory chip, or may be located elsewhere. In some cases the XOR output may be stored in a portion of the nonvolatile memory array itself. For example, in a portion of the memory array that maintains important information in SLC format in a "safe zone." It will be understood that the results of such an XOR operation can be used to reproduce any page of data used to calculate the XOR results as long as only one page is required. Thus, where lower page 2 is unreadable from WL2 it may be recovered by XORing together the stored XOR output with lower page 0, 1, 3, 4 . . . K.

A suitable circuit for XOR operations (which may be considered counting modulo 2 operations) may be provided in a memory controller or elsewhere and generally does not require significant space and does not have significant performance impact. A single XOR operation may be performed after all lower page data is written in a block, or data may be XORed page by page as it is written so that the XOR output represents an accumulated result of the pages written so-far. In this example, a valid XOR output is maintained even prior to writing all lower pages and there is no need for an additional step of reading out data and XORing prior to storage of upper page data in such a block.

FIG. 13B shows another example in which an XOR operation is performed across multiple blocks, in this case four blocks A, B, C, and D. The XOR output is stored in an additional block ("XOR") which may be considered an XOR block. In this case the XOR output is written as SLC data which allows it to be rapidly written with a low risk of disturbance. The blocks that are XORed together may be blocks that are programmed together. For example, blocks A, B, C, and D may be operated in parallel as a metablock so that data is striped across them when it is written. Four logical pages may be written as lower page data in blocks A, B, C, and D substantially in parallel. The XOR output from these pages may be written to the XOR block substantially in parallel also. It will be understood that blocks A, B, C, D, and the XOR block may be in different planes, on different dies, or otherwise formed in different portions of a large scale memory system. While FIGS. 13A and 13B show implementations that may be considered alternatives, different implementations may also be combined. For example, data may be XORed within a block and in addition may be XORed across blocks. Thus, if more than one page of data in a block is Uncorrectable by Error Correction Code ("UECC") and cannot be recovered by XORing together pages of the block then the UECC pages may be recovered using pages of other blocks. Multiple XOR schemes may thus be combined to provide protection against a range of different failure modes.

While the above examples refer to use of XOR for protection of lower page data from damage due to write abort when performing upper page programming, XOR may protect against other types of damage also. For example, data in a particular page may be UECC because of a physical defect in a memory array, or a power droop during programming, or for some other reason. Regardless of the reason, XOR data may be used to recover a page that is unreadable from the memory array. This approach may also be extended to upper page data which may be similarly XORed to allow recovery in case an upper page becomes unreadable.

Word Line Programming Order

In many memory systems, programming order from word line to word line is specified so that problems associated with word line to word line interactions are maintained at an acceptable level. It is common in MLC programming schemes to program lower pages one or more word lines ahead of upper pages. For example, WLn and WLn+1 may have lower page written before any upper page data is written along WLn. In SLC programming schemes, it is common to program word lines in sequence, i.e. WL0, then WL1, then WL2, and so on.

According to an aspect of the present invention, when word lines of an MLC block are programmed with lower page data only, prior to any upper page programming, nonsequential programming order may be used. The relatively small amounts of charge required for lower page programming may allow out-of-order programming of lower page data without significant word line to word line interactions in some cases.

Figures 14A, 14B, 15A, 15B:
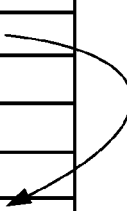
FIGS. 14A-B show an example of programming lower pages in nonsequential order.
FIGS. 15A-B show another example programming lower pages in nonsequential order.

FIGS. 14A and 14B shows a first example in which lower page data is written along even word lines first, with lower page data written along odd word lines only after completion of writing lower page data along even word lines. It has been found that threshold voltages of memory cells programmed to a given state tend to get lower as programming proceeds so that threshold voltages along WLK would generally be lower than along WL0 (where programming proceeds sequentially from WL0 to WLK). This is due to a "back pattern" effect, i.e. the effect of programmed memory cells in series with later-programmed memory cells. By programming lower page data along only half of the word lines first, any back pattern effect may be reduced by approximately half (e.g. when programming WLK-1 in FIG. 14A). Subsequent programming of the previously-skipped odd word lines may use different programming parameters to compensate for back pattern effects (e.g. by using higher programming voltages, more pulses of programming voltage, or otherwise). While the example shown programs even word lines and then odd word lines, this order may be reversed (i.e. odd word lines first, then even word lines). In other examples, other sequences may be used. For example, word lines may be programmed in three passes with every third word line programmed in a given pass (i.e. WL0, WL3, WL6, etc. in a first pass, WL1, WL4, WL7, etc. in a second pass, and WL2, WL5, WL8, etc. in a third pass).

FIGS. 15A and 15B show another example in which word lines are programmed with lower page data nonsequentially.

FIG. 15A shows programming of lower page data along WL0-WL3 and WL7-WLK. In this example, WL4-WL6 are skipped. Subsequently, as shown in FIG. 15B lower page data is programmed to WL4-WL6. One or more word lines may be skipped for various reasons. For example, a host may send updated data that skips certain logical addresses so that portions of data in the memory are obsoleted by the host while other portions remain valid. The new portions of data may be written in a block in a manner that leaves space for copying of valid data to the block so that all of the valid data can be written together in sequence as shown in FIG. 15B. This copying may be performed at a later time. Thus, the host write command may be executed rapidly. Subsequent copying allows data to be stored so that logical addresses are physically arranged in order. This generally provides a simpler way to store data than if data is fragmented in a block.

Figures 16, 17:
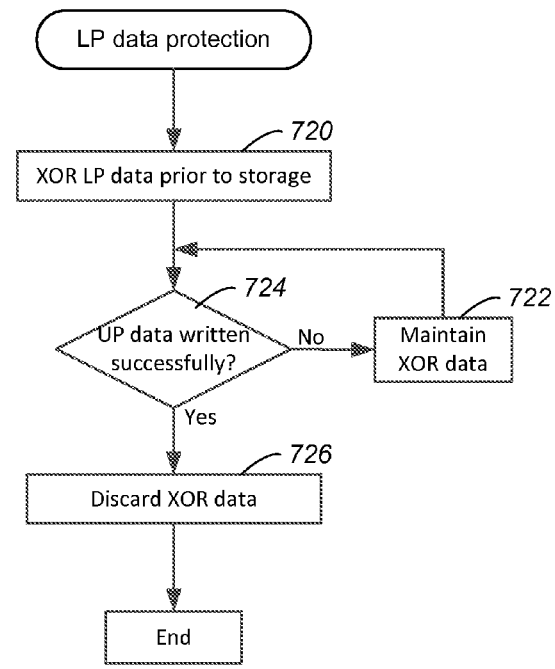
FIG. 16 shows another example of programming lower pages in nonsequential order.
FIG. 17 illustrates lower page protection using XOR data.

FIG. 16 shows another example of writing lower page data in a nonsequential order. In this case, a memory system is operating on two different threads that are directed to different logical address ranges. The memory system determines that data for both threads are to be stored in a given block and may store data for the two threads in different portions of the block accordingly. Data for the first thread is stored in lower pages of WL0-WLX-1 and data for the second thread is stored in lower pages of WLX-WLK. The memory system may interleave writes from one thread to another, or may prioritize one thread over another. In general, such nonsequential writing may allow efficient storage of data with little or no copying of data after it is written (i.e. data may be written once rather than written to a temporary location and later copied to a long-term location). This technique is not limited to two threads but may be applied to any number of threads.

FIG. 17 illustrates a protection scheme for lower page protection. Lower page data is XORed 720 prior to storage in the memory array. This may be done page-by-page as data is sent to memory dies for storage. An XOR output may be accumulated so that a valid XOR output is available at any time, not just after writing all pages. Thus, it is not necessary to program all lower page data in order to benefit from XORing. Even if a block has lower page data written along some word lines, while other word lines remain unwritten, XORing provides a way to recover any uncorrectable page. If upper page programming starts at any time after lower page data is written then lower page data is protected regardless of the amount of lower page data written.

After XOR data is calculated it is maintained 722 until Upper Page ("UP") data is successfully written 724 (e.g. until all upper pages are confirmed as written with no write abort). The XOR data may be maintained in any suitable location. Subsequently, only after all upper page data is successfully written, the XOR data is discarded 726. A determination that upper page data is successfully written may include checking upper page data against a copy that is stored elsewhere (e.g. performing a post-write read to check upper page data). Discarding XOR data may include erasing XOR data or marking XOR data as obsolete so that it can be erased at a later time.

Figure 18:
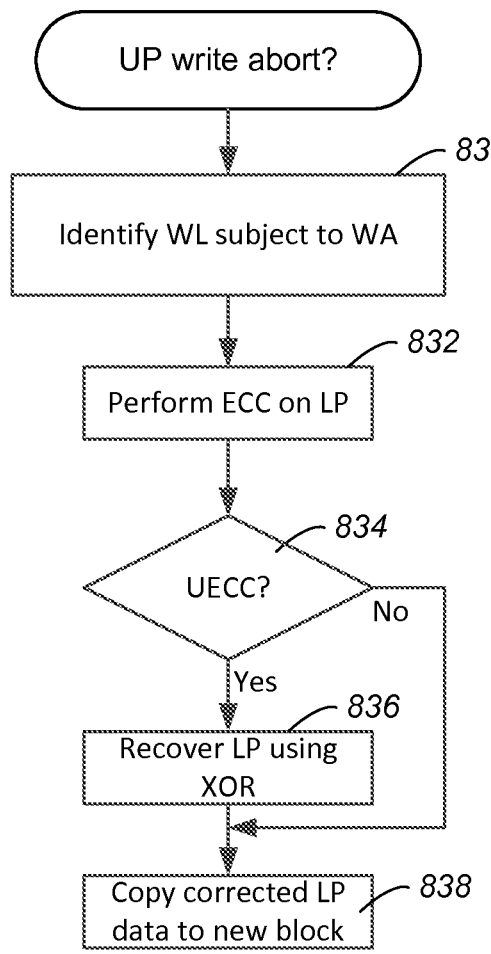
FIG. 18 illustrates handling of a write abort during upper page programming.

FIG. 18 shows how a write abort during upper page programming may be handled. When a write abort is detected, or suspected, an affected word line is identified 830 (i.e. the word line that was being written when the write abort occurred). Correction of lower page data may be attempted by ECC 832. A determination is made as to whether the data is uncorrectable by ECC (UECC) 834. If the data is UECC then the lower page data may be recovered 836 using the XOR output (i.e. by reversing the XOR calculation used to obtain the XOR output in order to generate the UECC page). If the data is not UECC then it does not need to be recovered using XOR. A copy of the lower page data may then be written to a new block 838 and the copy in the present block may be marked as obsolete.

Figure 19:
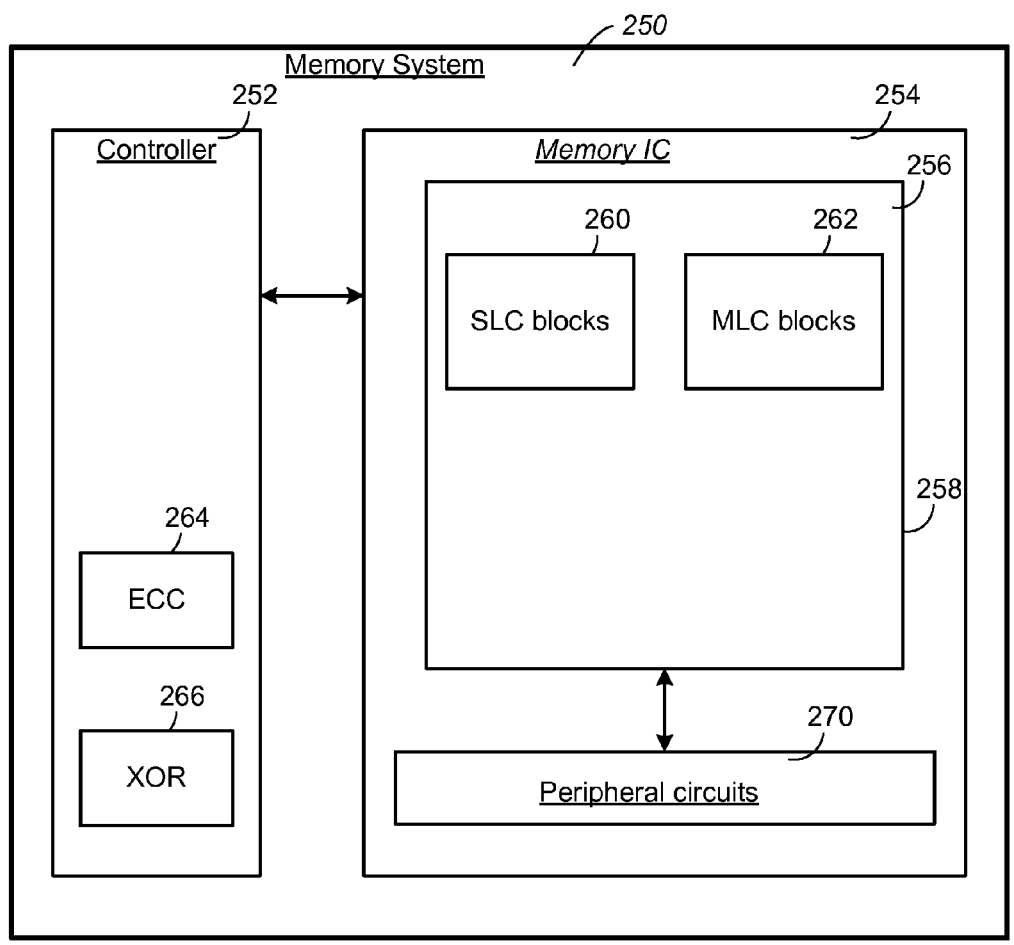
FIG. 19 illustrates an example of memory system hardware.

FIG. 19 shows an example of hardware that may be used to implement aspects of the present invention. In particular, FIG. 19 shows a memory system 250 that includes a memory IC 254 and a controller 252. It will be understood that a memory system may contain multiple memory ICs connected to a memory controller (e.g. connected together by a memory bus, or by multiple memory busses). The memory IC 254 includes a memory array 256 that includes both SLC blocks 260 and MLC blocks 262 in this example. At least some of the MLC blocks 262 may be written so that lower page data is written to multiple word lines (e.g. three or more word lines) prior to writing any upper page data to the block. SLC blocks 260 may include blocks used for important data including XOR output data. Peripheral circuits 270 (circuits associated with operation of the memory array) are also located on the memory IC 254. A memory controller 252 includes additional circuits associated with operation of the memory array including an ECC circuit 264 and an XOR circuit 266. The XOR circuit 266 may perform XORing of pages of data on a block-by-block basis (i.e. XORing lower pages of a block) or across multiple blocks (i.e. XORing lower pages of different blocks). The output of the XOR circuit may be stored in any suitable location. For example, XOR results may be stored in a safe zone in the memory array (e.g. in one or more SLC blocks) or may be stored in the memory controller.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a Multi Level Cell (MLC) nonvolatile three dimensional memory that is monolithically formed in one or more physical levels of arrays of memory cells having an active area above a silicon substrate, comprising:
   programming a plurality of word lines of a block of the MLC nonvolatile three dimensional memory with lower page data, leaving unwritten upper page capacity along the plurality of word lines;
   performing an Exclusive OR (XOR) operation on the lower page data of the plurality of word lines of the block;
   subsequently, maintaining results of the XOR operation for a period of time after the lower page data is programmed; and
   during the period of time when results of the XOR operation are maintained, writing upper page data along the plurality of word lines of the block.

2. The method of claim 1 further comprising, subsequent to writing the upper page data along the plurality of word lines of the block, discarding the results of the XOR operation.

3. The method of claim 1 wherein all word lines of the block are written with lower page data prior to any word lines of the block being written with upper page data.

4. The method of claim 1 wherein the XOR operation is applied to lower page data across a plurality of blocks.

5. The method of claim 1 wherein a plurality of XOR operations are performed as the plurality of word lines of the block are written so that accumulated XOR results are maintained throughout programming of the plurality of word lines of the block with lower page data.

6. The method of claim 1 wherein the XOR operation is performed only once for all lower page data of the block prior to programming any upper page data in the block.

7. The method of claim 1 wherein the plurality of word lines are programmed with only lower page data in a nonsequential order that skips one or more word lines of the block.

8. The method of claim 7 wherein the non-sequential order programs lower page data to odd numbered word lines first and subsequently programs lower page data to even numbered word lines or programs lower page data to even numbered word lines first and subsequently programs lower page data to odd numbered word lines.

9. The method of claim 8 wherein different programming parameters are used for programming lower page data to odd numbered word lines and programming lower page data to even numbered word lines.

10. The method of claim 7 wherein the one or more skipped word lines correspond to skipped logical addresses in data to be stored.

11. The method of claim 10 wherein the skipped word lines are subsequently programmed so that, subsequent to programming the skipped word lines, data in the plurality of word lines and the skipped word lines is in a logically sequential physical arrangement.

12. A three dimensional Multi Level Cell (MLC) nonvolatile memory comprising:
 a three dimensional array of MLC nonvolatile memory cells monolithically formed in physical levels, a level having an active area disposed above a silicon substrate, the array including at least one block in which three or more word lines are programmed with lower page data prior to any of the three or more word lines being programmed with upper page data;
 an exclusive OR (XOR) circuit that performs an XOR operation on lower page data of the three or more word lines and generates a corresponding XOR output; and
 an XOR storage element that maintains the output of the XOR circuit until after upper page data is written in the at least one block.

13. The MLC nonvolatile memory of claim 12 wherein all lower pages of an individual block are subject to a single XOR operation by the XOR circuit.

14. The MLC nonvolatile memory of claim 12 wherein an XOR operation extends across lower page data of multiple blocks.

15. The MLC nonvolatile memory of claim 12 further comprising write circuits that are configured to program the three or more word lines with lower page data in nonsequential order in which some word lines are initially skipped.

16. The MLC nonvolatile memory of claim 15 wherein the write circuits are configured to program alternating word lines and the three or more word lines are all odd word lines with even word lines initially skipped, or the three or more word lines are all even word lines with odd word lines initially skipped.

17. A method of operating a Multi Level Cell (MLC) nonvolatile three dimensional memory that is monolithically formed in one or more physical levels of arrays of memory cells having an active area above a silicon substrate, comprising:
 programming all active word lines of a block of the MLC nonvolatile three dimensional memory with lower page data only, the word lines of the block being programmed in a nonsequential order, leaving unwritten upper page capacity along word lines of the block;
 performing an Exclusive OR (XOR) operation on the lower page data of all the word lines of the block;
 subsequently, maintaining results of the XOR operation for a period of time after the lower page data is programmed; and
 during the period of time when results of the XOR operation are maintained, writing upper page data along the word lines of the block.

18. The method of claim 17 wherein the nonsequential order programs all odd word lines before programming any even word lines or programs all even word lines before programming any odd word lines.

19. The method of claim 18 wherein write parameters are used for even word lines are different to write parameters used for odd word lines.

20. A three dimensional Multi Level Cell (MLC) nonvolatile memory comprising:
 a three dimensional array of MLC nonvolatile memory cells monolithically formed in physical levels, a level having an active area disposed above a silicon substrate, the array including at least one block in which all word lines of the block are programmed with lower page data prior to any word line of the block being programmed with upper page data;
 write circuits that are configured to program the word lines of the block with lower page data in nonsequential order in which some word lines are initially skipped;
 an exclusive OR (XOR) circuit that performs an XOR operation on the lower page data of the word lines of the block and generates a corresponding XOR output; and
 an XOR storage element that maintains the output of the XOR circuit until after upper page data is written in the at least one block.

21. The MLC nonvolatile memory of claim 20 wherein the write circuits are configured to program all odd word lines before programming any even word lines or to program all even word lines before programming any odd word lines.

22. The MLC nonvolatile memory of claim 21 wherein the write circuits are configured to program odd word lines using a first set of write parameters and to program even word lines using a second set of write parameters that is different to the first set of write parameters.

* * * * *